United States Patent [19]
Nagayama

[11] Patent Number: 5,831,321
[45] Date of Patent: *Nov. 3, 1998

[54] SEMICONDUCTOR DEVICE IN WHICH AN ANTI-REFLECTIVE LAYER IS FORMED BY VARYING THE COMPOSITION THEREOF

[75] Inventor: Tetsuji Nagayama, Kanagawa, Japan

[73] Assignee: Sony Corporation, Tokyo, Japan

[ * ] Notice: This patent issued on a continued prosecution application filed under 37 CFR 1.53(d), and is subject to the twenty year patent term provisions of 35 U.S.C. 154(a)(2).

[21] Appl. No.: 712,256

[22] Filed: Sep. 11, 1996

Related U.S. Application Data

[62] Division of Ser. No. 416,218, Apr. 4, 1995, Pat. No. 5,674,356.

[30] Foreign Application Priority Data

Apr. 5, 1994 [JP] Japan ..................................... 6-066926

[51] Int. Cl.$^6$ ..................................... H01L 29/76
[52] U.S. Cl. .......................... 257/412; 257/413; 257/437; 257/639; 257/640; 257/646; 257/649
[58] Field of Search ..................................... 257/412, 413, 257/437, 456, 639, 640, 646, 649

[56] References Cited

U.S. PATENT DOCUMENTS

| | | | |
|---|---|---|---|
| 4,070,689 | 1/1978 | Coleman et al. | 257/437 |
| 4,145,457 | 3/1979 | Kersten | 427/38 |
| 4,541,892 | 9/1985 | Jeuch | 156/643 |
| 4,592,129 | 6/1986 | Legge | 29/572 |
| 4,680,742 | 7/1987 | Yamada et al. | 369/13 |
| 4,793,897 | 12/1988 | Dunfield et al. | 156/643 |
| 4,837,044 | 6/1989 | Murarka et al. | 427/10 |
| 4,978,420 | 12/1990 | Bach | 156/643 |
| 5,076,674 | 12/1991 | Lynam | 359/274 |
| 5,286,608 | 2/1994 | Koh | 430/313 |
| 5,378,659 | 1/1995 | Roman et al. | 437/229 |

FOREIGN PATENT DOCUMENTS

| | | | |
|---|---|---|---|
| 62 104081 | 5/1987 | Japan | 257/437 |
| 63 71801 | 4/1988 | Japan | 257/437 |
| 63 79322 | 4/1988 | Japan . | |

*Primary Examiner*—Minh-Loan Tran
*Attorney, Agent, or Firm*—Hill & Simpson

[57] ABSTRACT

A semiconductor device in which dry etching properties are rendered compatible with satisfactory anti-reflection characteristics in far-infrared lithography the semiconductor device has a semiconductor substrate and an electrode and wire pattern on the substrate. The semiconductor device also has an anti-reflective layer on the substrate which presents a variation in the composition of a constituent element along the film thickness over the semiconductor substrate. The anti-reflective layer is selected from the group consisting of $SiO_x$, $SiN_x$ and $Si_xO_yN_z$.

9 Claims, 4 Drawing Sheets

SEMICONDUCTOR DEVICE IN WHICH AN ANTI-REFLECTIVE LAYER IS FORMED BY VARYING THE COMPOSITION THEREOF

This is a division of application Ser. No. 08/416,218 filed Apr. 4, 1995, now U.S. Pat. No. 5,674,356.

BACKGROUND OF THE INVENTION

This invention relates to a method for producing a semiconductor device. More particularly, it relates to a method for method for forming a fine pattern by utilizing an anti-reflective layer which may be formed easily by a simplified process and which is excellent in etching characteristics while exhibiting a sufficient anti-reflection effect.

In keeping up with an accelerated tendency towards high integration of semiconductor devices, the minimum working dimension is being reduced rapidly. For example, the minimum working dimension of the 16 MDRAM of the current generation, which is being transferred to a mass-production line, is approximately 0.5 μm, while the minimum working dimension of the 64 MDRAM of the next generation and that of the 256 MDRAM of the next-to-next generation are estimated to be 0.35 μm or less and 0.25 μm or less, respectively.

The degree of size diminution depends to a large extent on the resolution of the lithographic process producing a mask pattern. For working on the order of 0.35 to 0.25 μm (deep sub-micron class), a far ultra-violet light, such as a KrF excimer laser beam with a wavelength of 248 nm, is necessitated. However, since the process employing such monochromatic light suffers from the lowering in resolution or contrast due to halation or the standing-wave effect, use of an anti-reflective layer for weakening the intensity of light reflected from the underlying film is thought to be indispensable.

As the materials making up the anti-reflective layer, amorphous silicon, polysilicon, $SiO_X$, TiN or TiON have so far been employed. Not only the monolayer anti-reflective layer, but also the multi-layer film, formed by lamination of two or more films of different materials, have been known and utilized as the anti-reflective layer.

In JP Patent Kokai Publication JP-A-63-79322 (1988), there is disclosed a method including sequentially laminating a first anti-reflective layer of $SiO_X$ having a small refractive index n (n=1.5) and a second anti-reflective layer of polysilicon having a larger refractive index (n=1.64) on the surface of a substrate and carrying out g-ray lithography on the resist film of a large refractive index n (n=1.64) thereon to realize high resolution.

It has recently been shown that SiON (silicon nitride oxide) exhibits excellent optical constants n and k which represent the real number part and the imaginary number part of the complex refractive index, respectively, in a far-ultraviolet region shorter in wavelength than the g-ray, and may be conveniently applied to excimer laser lithography even in the form of a monolayer film. This technique is disclosed in U.S. patent applications Ser. Nos. 07/998,743 and 08/175,299 for Method of Determining Conditions for Anti-Reflective Layer, a Method of Forming an Anti-Reflective Layer and a Method of Forming a Resist Pattern by Using Novel Anti-Reflective Layer, each of which has been assigned to the same assignee as that for the present application. The disclosure of two noted references is hereby incorporated herein. As shown in these references, the optical constant of the SiON based material can be changed extensively by controlling the gas composition at the time of the film formation, and hence permits of high design freedom degree. The approximate elemental composition of the SiON based material is Si:O:N=2:1:1.

After patterning of the resist mask by such photolithography, the anti-reflective layer is naturally etched during the next dry etching process.

However, with the SiON based material, the composition is intermediate between Si and $SiO_X$ (silicon oxide), as may be demonstrated by the fact that Si accounts for approximately 50% of the composition. Thus the SiON based material has etching characteristics intermediate between those of Si and $SiO_X$, such that it is not necessarily easy to optimize the etching conditions for such material. The problems raised during the etching will be discussed by referring to FIGS. 10 to 12.

In these figures, the process of etching the SiON anti-reflective layer coated on a W-polycide film 25 is shown. A sample wafer is formed by sequentially depositing a W-polycide film 25 and a SiON anti-reflective layer 26 on a Si substrate 21 via a gate oxide film 22 and by forming a resist mask 27 patterned to a pre-set shape, as shown in FIG. 10. The W-polycide film 25 is made up of an impurity-containing polysilicon film 23 and a tungsten silicide ($WSi_X$) film 24, deposited in this order from the lower side.

If now the SiON anti-reflective layer 26 is etched using a fluorocarbon-based etching gas under the etching conditions for $SiO_X$, the etch rate is retarded significantly because SiON is more Si-rich than $SiO_X$ and hence the carbon-based polymer is deposited in excess.

If, on the other hand, the etching conditions for Si are applied by employing the chlorine-based gas, the edge of the resist mask 27 is receded gradually because SiON is more O-rich than Si and hence the resist mask 27 is eroded under the action of oxygen radicals (O*) yielded during etching.

In any case, the etched SiON anti-reflective layer 26t (the suffix t herein indicating "being tapered") has its edge tapered and protruded more outwardly than the edge of the resist mask 27.

If the W-polycide film 25 is etched in such state using e.g. a $Cl_2/O_2$ mixed gas, the oxygen radicals (O*) are yielded from the edge of the ion-irradiated SiON anti-reflective layer 26t, such that the carbon-based sidewall protection film is removed in the form of $CO_X$. The result is that a gate electrode 25e (the suffix e herein indicating "being eroded") is undercut significantly, as shown in FIG. 12. Such undercut is more outstanding with the $WSi_X$ layer 24 than with a polysilicon film 24e because W in the $WSiO_X$ layer 24e is removed as $WClO_X$ thus rapidly raising the etch rate. Such phenomenon becomes most outstanding during over-etching.

If the shape of the gate electrode is deteriorated in this manner, not only the resistor of the interconnection deviates from the design value but also it becomes difficult to form a sidewall for achieving the LDD structure.

If the multi-layer anti-reflective layer, described in JP Patent Kokai Publication JP-A-63-79322 (1988), is employed, and the etching conditions are changed over in the course of the etching, the edge of the anti-reflective layer is not tapered so that the underlying film may be etched anisotropically. However, two films of different film materials, namely the $SiO_X$ and polysilicon films, need to be formed by different process steps. In addition, if the film having a high refractive index of n=5, is laminated, the wavelength of the standing wave generated in the anti-reflective layer becomes excessively small with the future photolithographic technique employing a short wavelength light source such that it becomes difficult to perform film thickness control for achieving anti-reflection effects.

SUMMARY OF THE INVENTION

It is therefore a principal object of the present invention to provide a method for preparing a semiconductor device wherein an extremely fine pattern can be formed by utilizing an anti-reflective layer which can be formed by a simplified process and which is superior in etching characteristics while displaying sufficient anti-reflection effects.

According to the present invention, there is provided a method for producing a semiconductor device including the steps of providing an anti-reflective layer presenting variation in the composition of a constituent element along the film thickness over a semiconductor substrate, forming a patterned resist on the anti-reflective layer $6_H$, and dry-etching the anti-reflective layer under etching conditions conforming to the variation in the composition, using the patterned resist as a mask.

Thus, in a majority of cases, the composition of the anti-reflective layer formed in accordance with the present invention is not the stoichiometric composition.

If the anti-reflective layer is formed by a vapor phase deposition method, the variation in the composition may be afforded by suitably controlling the film-forming atmosphere. If, in the CVD method or reactive sputtering method, the chemical composition or the flow rate of the starting gas or the sputtering gas is modified with lapse of the film-forming time, the ratio of the constituent element in the composition of the anti-reflective layer is varied in a pre-set manner along the film thickness.

If, alternatively, the ion implantation is used, the variation in the composition may be realized without regard to the method of forming the anti-reflective layer. That is, by suitably selecting the implanted ion species or the ion accelerating energy, the ratio of a specified element may be elevated at a desired depth or within a desired range from the surface. The ion implantation has an ancillary effect of destroying the anti-reflective layer for providing an amorphous structure and raising the etch rate. The dosage necessary to cause such destruction and to provide an amorphous structure is roughly on the order of $10^{15}/cm^2$, depending on the mass of ion species employed.

In any case, it is necessary with the present invention to change over the etching conditions during etching of the anti-reflective layer. The changeover timing can be determined by monitoring the emission spectrum or by timing controlling based on the previously measured etch rate.

Meanwhile, the above variation in the composition may be accompanied by fluctuations in the refractive index. If the anti-reflective effect is taken into account, the high refractive index area is preferably provided as an upper layer region rather than as a lower layer region. If the refractive index of the high refractive index region is higher than that of the overlying photoresist coating layer, the high refractive index region is sandwiched between the low refractive index regions, that is the substrate side low refractive index region and the usual photoresist region, such that multiple reflection is effectively absorbed within the high refractive index region.

The anti-reflective layer worked by the method of the present invention may be any type of film if it exhibits improved etching performance by varying the composition of the constituent element along the film thickness and also if it exhibits satisfactory anti-reflection effect in the wavelength range in the wavelength area employed in photolithography.

However, a film of Si compounds is most preferred in consideration that the Si compounds exhibit optical properties that may be easily employed in the far ultra-violet range and also exhibit outstanding changes in the etching performance conforming to the Si ratio. Typical of the films of the Si compounds are $SiO_X$, $SiN_X$ and SiON. If the Si ratio variation is afforded to the film of the Si compounds, high precision etching may be performed under the dry etching conditions for the Si-rich region.

It was previously found in the previous application assigned to the same assignee as that of the present application that the refractive index tends to be raised with increase in the Si ratio, insofar as the $SiO_X$, $SiN_X$ and SiON films are concerned. Consequently, by setting the Si ratio so as to be higher at the upper layer side than at the lower layer side of the anti-reflective layer, it is possible to increase the refractive index at the upper layer side. Such constitution is advantageous in improving the resolution in photolithography.

Although the anti-reflective layer is employed in general for reducing the reflectance of a directly underlying film of the high refractive index material, it may also be employed for decreasing the reflectance from a film of the high refractive index material underlying the film directly underlying the anti-reflective layer. If a via-hole is to be formed in the transparent $SiO_X$ insulating film for having contact with an underlying Al-based metallization film, it is possible to form an SiON based anti-reflective layer on the $SiO_X$ interlayer insulating film in order to suppress reflection from the underlying Al-based metallization film.

According to the present invention, the ratio of the constituent element in the anti-reflective layer is varied along the film thickness for achieving not only the desired anti-reflective effect on the whole but also the optimized dry etching properties. The ratio distribution may be finely controlled on the nanometer order by controlling the film-forming atmosphere in the vapor phase deposition method or by ion implantation. Since the elementary composition remains the same throughout the anti-reflective layer, there is no necessity of effecting film formation by a separate process as in the case of a conventional multi-layer anti-reflective layer made up of, for example, $SiO_X$ and polysilicon, thereby significantly simplifying the film-forming process.

Above all, if the film of Si compounds, such as $SiO_X$, $SiN_X$ or SiON, is used as an anti-reflective layer, and its Si ratio is varied, the Si-rich area may be anisotropically etched under the etching conditions for single-crystal silicon or polysilicon. Thus it becomes possible to prevent the film edge portions from becoming tapered to prohibit deterioration in the shape anisotropy of the underlying film.

Since the film of these Si compounds has a composition region the refractive index of which is increased with increase in the Si ratio, a high refractive index film may be disposed at the upper layer side of the anti-reflective layer, thereby exhibiting an excellent standing wave suppressing effect.

EXAMPLES

The present invention will be explained in detail with reference to illustrative Examples.

Example 1

The present Example is directed to working of a tungsten (W)- polycide gate electrode. An anti-reflective layer on the W-polycide film was formed as a $SiO_X$ film under CVD conditions which were modified in the course of the working so that an upper layer of the film was of a Si-rich composition. The $SiO_X$ film thus produced was etched under application sequentially of an etching condition for Si and an etching condition for $SiO_X$. The process of the present Example 1 is explained by referring to FIGS. 1 to 5.

Figure 1:
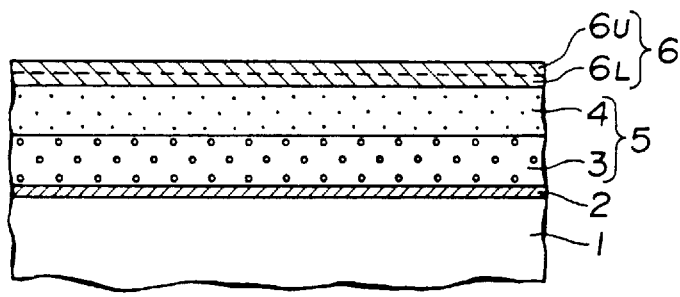
FIG. 1 is a schematic cross-sectional view showing the state in which, in an illustrative process of working a polycide gate electrode according to the present invention, a $SiO_X$ film or a SiON film having its Si ratio varied along the film thickness is formed on a W-polycide film.
Figure 2:
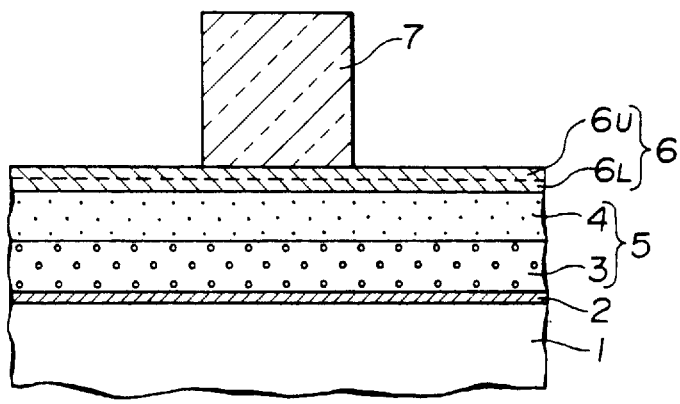
FIG. 2 is a schematic cross-sectional view showing the state in which a resist pattern has been formed on the anti-reflective layer.

First, as shown in FIG. 1, a gate oxide film 2 was formed to a thickness of approximately 10 nm on an Si substrate 1. A polysilicon layer 3 and a tungsten silicide ($WSi_X$) layer 4, each 50 nm in thickness, were formed thereon to form a W-polycide film 5 about 100 nm in thickness. The resulting wafer was transported into a CVD unit and an $SiO_2$ film was formed as an anti-reflective layer 6 by two stages of the film forming conditions, namely the first stage of the $SiH_4$ flow rate of 250 SCCM, the $O_2$ flow rate of 250 SCCM, the $N_2$ flow rate of 100 SCCM, a gas pressure of 133 Pa, the film-forming temperature of 420° C. and the film-forming time of 2 minutes, and the second stage of the $SiH_4$ flow rate of 400 SCCM, the $O_2$ flow rate of 50 SCCM, the $N_2$ flow rate of 100 SCCM, the gas pressure of 133 Pa, the film-forming temperature of 420° C., and the film-forming time of 15 seconds.

In the first stage, a SiON film about 45 nm in thickness was formed as a lower anti-reflective layer $6_L$. In the second stage, a Si-rich SiON film about 5 nm in thickness was formed as an upper anti-reflective layer $6_U$ by significantly lowering the rate of flow of $O_2$ relative to that of $SiH_4$. The above two film-forming stages may be easily achieved only by changing the gas flow rates within the same film-forming chamber.

A resist pattern 7 having a pattern width about 0.35 μm was formed on the above anti-reflective layer 6 through the route of photolithography employing a chemical amplifier photoresist material manufactured by WAKO PURE CHEMICALS CO. LTD. under the trade name of WKR-Pt1 and a KrF excimer laser stepper. During the photolithographic process, the reflected light from the underlying $WSi_X$ layer 4 was effectively attenuated under the effect of the anti-reflective layer 6 having a dual-layer structure and having the refractive index increased at the upper layer side, such that the resist pattern 7 having a satisfactory shape could be formed.

The above wafer was set on a magnetic micro-wave plasma etching device and the upper anti-reflective layer $6_U$ was etched under the illustrative conditions of the $SF_6$ flow rate of 20 SCCM, a gas pressure of 1.3 Pa, the micro-wave output of 800 W (2.45 GHz), the RF bias power of 20 W (2 MHz) and the wafer setting electrode temperature of 20° C. (cooling with water).

Figure 3:
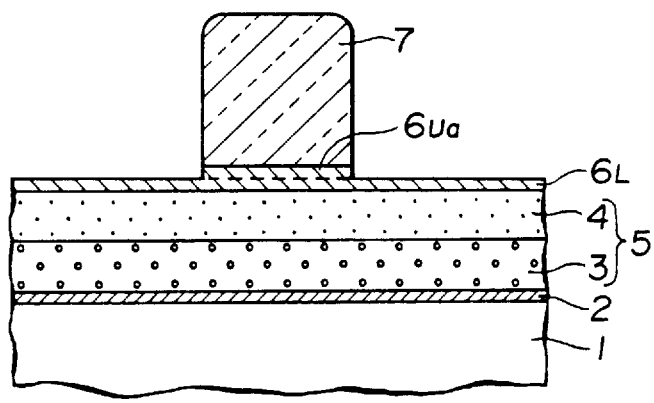
FIG. 3 is a schematic cross-sectional view showing the state in which a Si-rich upper layer portion of the $SiO_X$ anti-reflective layer has been selectively etched.

The above-mentioned low-bias conditions by the F-based gas represent the conditions that may be applied to etching of an Si-based film. However, since the upper-layer anti-reflective layer $6_U$ is of a Si-rich composition, an upper-layer anti-reflective layer pattern $6_{Ua}$ having a satisfactory shape anisotropy could be formed, as shown in FIG. 3 (the suffix a herein indicating "anisotropic").

The etching conditions were then changed over to a c-$C_4F_8$ flow rate of 50 SCCM, a gas pressure of 0.5 Pa, the micro-wave output of 1200 W (2.45 GHz), the RF bias power of 200 W (2 MHz) and the wafer setting electrode temperature of 20° C. (cooling with water).

Figure 4:
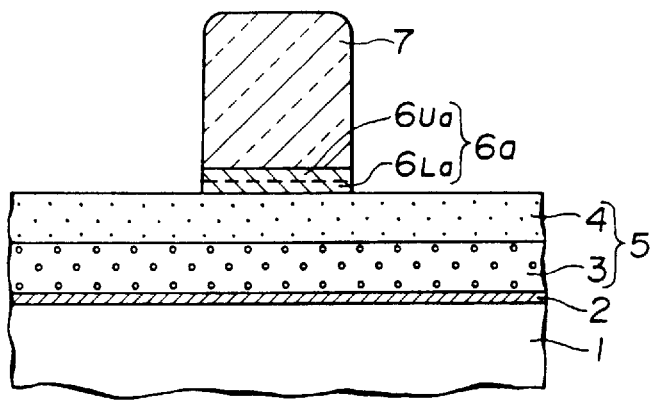
FIG. 4 is a schematic cross-sectional view showing the state in which a lower layer portion of the $SiO_X$ anti-reflective layer of FIG. 3 has been selectively etched.
Figure 5:
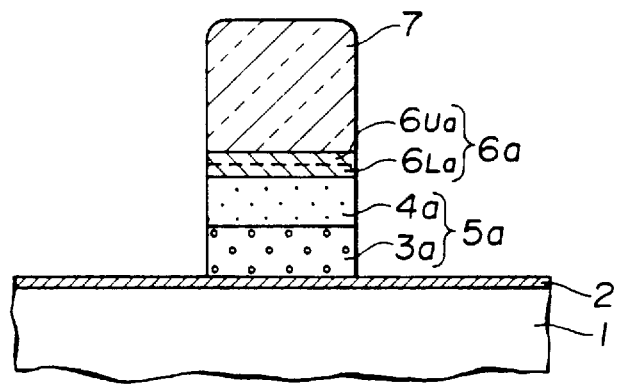
FIG. 5 is a schematic cross-sectional view showing the state in which the W-polycide film has been etched anisotropically.

Under these illustrative etching conditions for the film of the $SiO_X$ based material, a lower anti-reflective layer pattern $6_{La}$ having a satisfactory anisotropic shape was formed, as shown in FIG. 4. As a result, an anti-reflective layer pattern 6a having an anisotropic shape on the whole was formed, without tapering at the film edge as was formed in the conventional practice.

The W-polycide film 5 was etched under the following illustrative conditions of the $Cl_2$ flow rate of 72 SCCM, the $O_2$ flow rate of 8 SCCM, the gas pressure of 0.4 Pa, the micro-wave power of 750 W (2.45 GHz), the RF bias power of 40 W (2 MHz) and the wafer setting electrode temperature of 0° C. (by using alcohol-based coolant).

Since the anti-reflective layer 6 was already formed by anisotropic etching, a gate electrode 5a made up of a $WSi_X$ pattern 4a and a polysilicon pattern 3a, both having a satisfactory anisotropic shape, could be formed by this process without producing undercutting.

Example 2

Similarly to Example 1, the present Example is directed to working of a tungsten (W)- polycide gate electrode. An anti-reflective layer on the W-polycide film was formed as a SiON film under CVD conditions which were modified in the course of the working so that an upper layer of the film was of a Si-rich composition. The anti-reflective layer was etched by sequentially applying the etching conditions for Si and those for SiO$_X$. The figures to be referred to are FIGS. 1 to 5 an detailed description is omitted for those portions which are the same as those of Example 1.

The process up to the formation of the W-polycide film 5 was carried out in the same way a in Example 1. This wafer was transported into a plasma CVD device and the SiON film as the anti-reflective layer 6 was formed by two stages of the film forming conditions, namely the first stage of the SiH$_4$ flow rate of 30 SCCM, the N$_2$O flow rate of 70 SCCM, a gas pressure of 400 Pa, the RF power of 500 W (13.56 MHz), the film-forming temperature of 360° C. and the film-forming time of 40 seconds, and the second stage of the SiH$_4$ flow rate of 70 SCCM, the N$_2$O flow rate of 30 SCCM, the gas pressure of 400 Pa, the RF power of 500 W (13.56 MHz), the film-forming temperature of 360° C., and the film-forming time of 5 seconds.

By the above first and second stages, the SiON film about 45 nm in thickness and the Si-rich SiON film about 5 nm in thickness were formed as the lower anti-reflective layer $6_L$ and as the upper anti-reflective layer $6_H$, respectively.

On such anti-reflective layer 6, the resist pattern 7 having a satisfactory anisotropic shape could be formed by excimer laser photolithography.

The upper anti-reflective layer $6_H$ and the lower anti-reflective layer $6_L$ were subsequently dry etched in the same way as in Example 1, whereby an anti-reflective layer pattern 6a having satisfactory anisotropic shape could be formed. Thus the subsequent etching of the W-polycide film 5 could be carried out with high accuracy.

Example 3

The present Example is directed to formation of a SiO$_X$ anti-reflective layer 6 similar to the anti-reflective layer of Example 1, in which the upper anti-reflective layer $6_U$ was formed by ion implantation, rather than by changing the conditions for reduced-pressure CVD. The process of the present Example is explained by referring to FIGS. 6 and 7.

Figure 6:
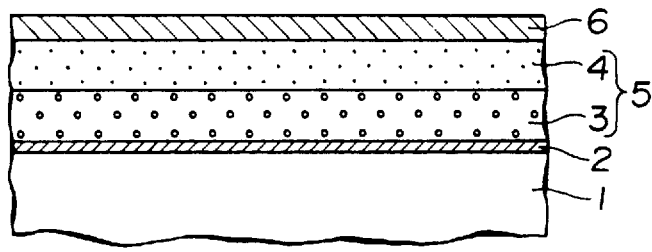
FIG. 6 is a schematic cross-sectional view showing the state in which, in another illustrative process of working a polycide gate electrode according to the present invention, an anti-reflective layer has been formed on a W-polycide film.
Figure 7:
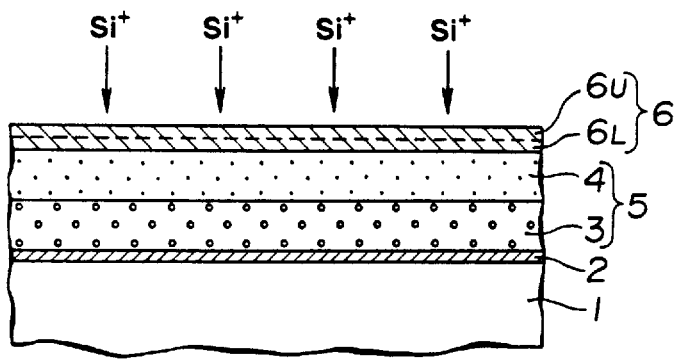
FIG. 7 is a schematic cross-sectional view showing the state in which a Si-rich upper-layer portion of an anti-reflective layer has been formed by ion implantation into the anti-reflective layer shown in FIG. 6.

FIG. 6 shows the state in which a SiO$_X$ film about 50 nm in thickness was formed a the anti-reflective layer 6 on the W-polycide film 5. The film forming conditions are the same as those of the first stage o Example 1 except that the film-forming time was set to 2 minutes 30 seconds.

Into this wafer were implanted Si$^+$ ions under the illustrative conditions of the ion acceleration energy of 10 keV and a dosage of $1 \times 10^{17}$/cm$^2$. As a result, the upper layer side of the anti-reflective layer 6 was converted into an upper anti-reflective layer $6_U$ composed of a Si-rich SiO$_X$ film, with the lower layer side thereof being left as the lower layer side anti-reflective layer $6_L$ which has retained its original composition. The anti-reflective layer 6, thus formed, showed excellent standing wave suppressing effects.

The subsequent photolithographic and dry etching processes were carried out in the same way as in Example 1. In the present Example, satisfactory anisotropic etching could be achieved.

Example 4

Figure 8:
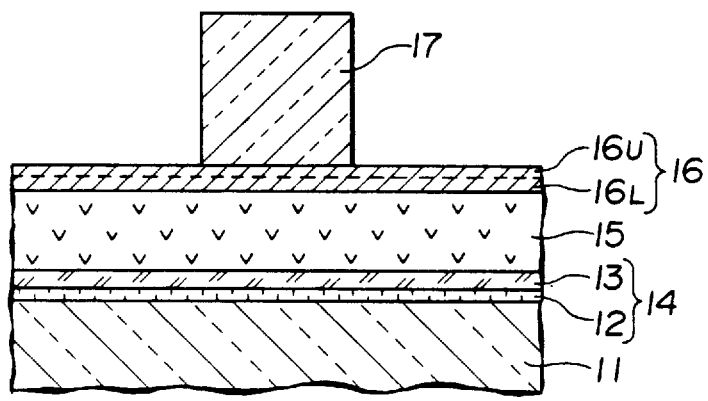
FIG. 8 is a schematic cross-sectional view showing the state in which, in an illustrative process of working Al-based metallization according to the present invention, a $SiN_X$ anti-reflective layer has been formed on an Al-1% Si film.

The present Example is directed to working of an Al-based metallization, in which the CVD film-forming conditions for the anti-reflective layer formed by a SiN$_X$ film on the Al-1% Si film were changed during the working to provide a Si-rich upper-layer portion, and etching was carried out under application sequentially of the etching conditions for Si and those for SiN$_X$. The process for the present Example is explained by referring to FIGS. 8 and 9.

A wafer made up of an interlayer insulating film 11, a barrier metal layer 14 about 100 nm in thickness formed thereon and an Al-1% Si film 15 about 300 nm in thickness formed on the barrier metal 14, was prepared. The barrier metal 14 is made up of a Ti layer 12 about 30 nm in thickness and a TiON layer 13 about 70 nm in thickness, laminated sequentially looking from the lower layer side.

The wafer was transported into a plasma CVD unit and a SiN$_X$ film as an anti-reflective layer 16 was formed under the illustrative two stages of the film forming conditions, namely the first stage of the SiH$_4$ flow rate of 180 SCCM, the NH$_3$ flow rate of 500 SCCM, the N$_2$ flow rate of 720 SCCM, a gas pressure of 400 Pa, the RF power of 500 W (13.56 MHz), the film-forming temperature of 250° C. and the film-forming time of 40 seconds, and the second stage of the SiN$_4$ flow rate of 500 SCCM, NH$_3$ flow rate of 100 SCCM, the NH$_3$ flow rate of 100 SCCM, the N$_2$ flow rate of 700 SCCM, a gas pressure of 400 Pa, the RF power of 500 W (13.56 MHz), the film-forming temperature of 250° C. and the film-forming time of 5 seconds.

By the above first and second stages, the SiN film about 45 nm in thickness and the Si-rich SiON film about 5 nm in thickness were formed as the lower anti-reflective layer $16_L$ and as the upper anti-reflective layer $16_U$, respectively. The refractive index of the upper anti-reflective layer $16_U$ was higher than that of the lower anti-reflective layer $16_L$.

The photolithographic process was carried out as in Example 1 to form a resist pattern 17 about 0.35 $\mu$m in width. With this photolithographic process, the reflected light from the Al-1% Si film 15 was efficiently attenuated by the anti-reflective layer 16 composed of the SiN$_X$ film, such that a fine resist pattern 17 was formed with excellent resolution.

The above wafer was set on a magnetic micro-wave plasma etching device and the upper anti-reflective layer $16_U$ and the lower anti-reflective layer $16_L$ were etched in this order under the etching conditions for Si and for SiO$_X$, respectively. Basically, the etching conditions for SiO$_X$ can be applied to the etching of SiN$_X$. The same etching conditions as those of Example 1 were used herein. As a result, the upper-layer anti-reflective layer $16_{Ua}$ and the lower anti-reflective layer $16_{La}$ exhibiting good shape anisotropy as shown in FIG. 9 were formed, such that an anti-reflective layer pattern 16a having the anisotropic shape on the whole could be produced.

Subsequently, the Al-1% Si film 15 and the barrier metal 14 were collectively etched under the conditions of the BCl$_3$ flow rate of 40 SCCM, the Cl$_2$ flow rate of 60 SCCM, the gas pressure of 1.3 Pa, the micro-wave power of 950 W (2.45 GHz), the RF bias power of 50 W (2 MHz) and the wafer setting electrode temperature of 20° C. (by cooling with water).

Figure 9:
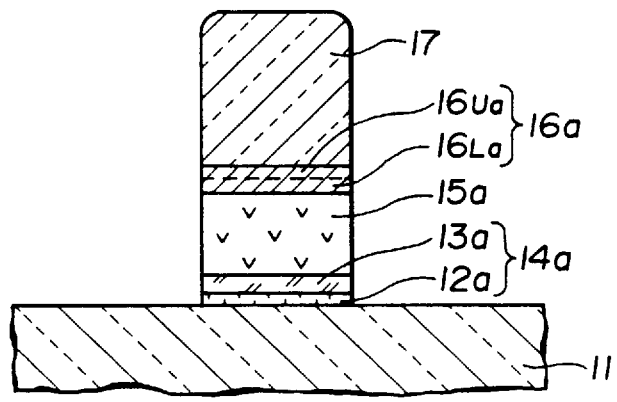
FIG. 9 is a schematic cross-sectional view showing the state in which the $SiN_X$ anti-reflective layer, Al-1% Si film and a barrier metal layer of FIG. 8 are anisotropically etched in this order.
Figure 10:
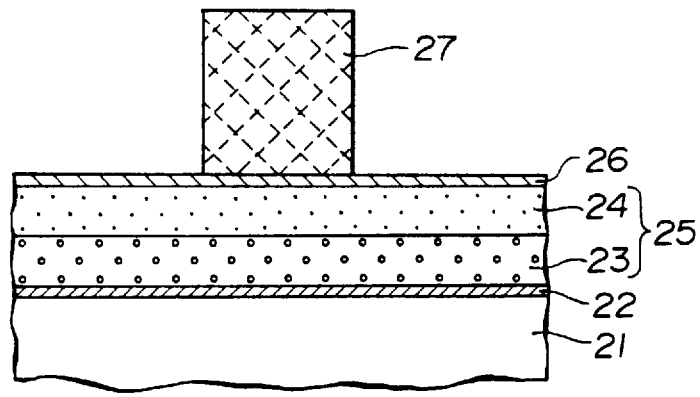
FIG. 10 is a schematic cross-sectional view showing the state of a wafer having a SiON anti-reflective layer prior to dry etching in working of a conventional polycide gate electrode.
Figure 11:
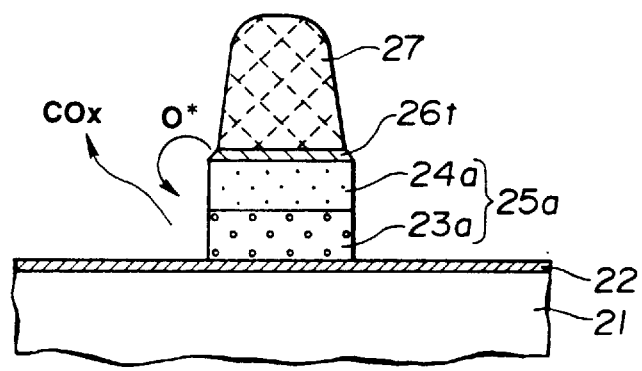
FIG. 11 is a schematic cross-sectional view showing the state in which the SiON anti-reflective layer of FIG. 10 has been tapered.
Figure 12:
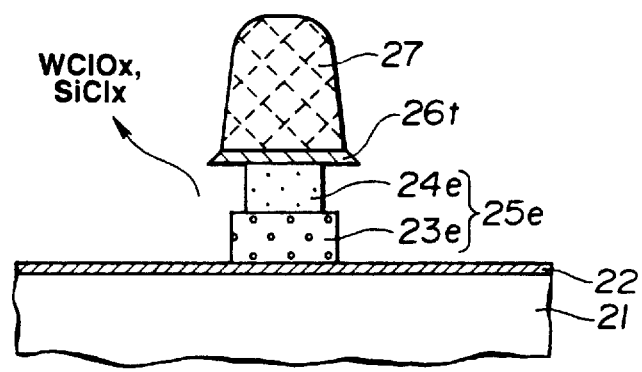
FIG. 12 is a schematic cross-sectional view showing the state in which shape anisotropy is deteriorated during overetching of a W-polycide film of FIG. 11.

During the present process, etching of the Al-1% Si film 15 and the barrier metal 14 proceeded anisotropically, as shown in FIG. 9, in which the anisotropically etched layers are indicated by the original numerals for the corresponding non-etched layers with appended suffixes a. There was no undercut produced as a result of the tapered anti-reflective layer pattern as was produced with the conventional practice.

The present invention is not limited to the above-described four illustrative Examples.

For example, while only the variations in the Si ratio by the CVD process have been explained in connection with the $SiN_X$ or SiON anti-reflective layers, these variations may also be achieved by ion implantation.

In addition, the CVD conditions, ion implantation conditions, types of the dry etching devices, dry etching conditions, light exposure wavelengths in photolithography or the constitution of the wafer as an etching sample, may be selected or modified in a desired manner.

It will be appreciated from the foregoing that, by varying the ratio of a constituent element of an anti-reflective layer along the film thickness thereof, it becomes possible to realize compatibility between the desired anti-reflective effect and the optimum dry etching performance. Above all, the anti-reflective layer formed of a Si compound exhibits a superior standing wave suppressing effect in the far ultra-violet photolithography of the next generation and the next-to-next generation. Thus the present invention contributes to diminution, integration and reliability of semiconductor devices.

What is claimed is:

1. A semiconductor device comprising:
   a semiconductor substrate; and
   an anti-reflective layer on said substrate said anti-reflective layer being a single layer of a material having a composition with one of its constituent elements varied in quantity along the thickness of the layer over the semiconductor substrate, the anti-reflective layer being selected from the group consisting of $SiO_x$, $SiN_x$ and $Si_xO_yN_z$.

2. The semiconductor device as claimed in claim 1, wherein the anti-reflective layer has a composition selected such that an upper layer portion thereof has a refractive index higher than that of a lower layer portion.

3. The semiconductor device as claimed in claim 2, wherein the anti-reflective layer is a film formed of a silicon compound and having a composition with a variable silicon ratio.

4. The semiconductor device as claimed in claim 2, wherein the anti-reflective layer has a silicon-rich upper layer portion.

5. The semiconductor device as claimed in claim 2, wherein the anti-reflective layer is a film formed of a silicon compound and having a silicon ratio in the composition thereof increased from its lower layer portion towards its upper layer portion.

6. The semiconductor device as claimed in claim 2, further comprising a photoresist film formed over the anti-reflective layer, wherein the anti-reflective layer is film having a lower refractive index area and a high refractive index area formed on the low refractive index area, said higher refractive index area having a refractive index higher than that of the photoresist film.

7. The semiconductor device as claimed in claim 1, wherein the anti-reflective layer is a film formed of a silicon compound having a variable silicon ratio.

8. The semiconductor device as claimed in claim 1, wherein the anti-reflective layer has a silicon-rich upper layer portion.

9. The semiconductor device as claimed in claim 1, wherein the anti-reflective layer is film formed of a silicon compound having a silicon ratio which increases proceeding from a lower layer portion thereof toward an upper layer portion thereof.

* * * * *